(12) United States Patent
Fu et al.

(10) Patent No.: US 12,319,561 B2
(45) Date of Patent: **\*Jun. 3, 2025**

(54) COIL MODULE FOR ELECTROMAGNETIC MICROSPEAKER, COIL MODULE ARRAY AND PREPARATION METHOD THEREOF

(71) Applicant: Otowahr Technology Inc., Hsinchu (TW)

(72) Inventors: Yu Min Fu, Hsinchu (TW); Tung Yu Wu, Hsinchu (TW); Tse Chih Tang, Hsinchu (TW)

(73) Assignee: Otowahr Technology Inc., Hsinchu (TW)

( \* ) Notice: Subject to any disclaimer, the term of this patent is extended or adjusted under 35 U.S.C. 154(b) by 0 days.

This patent is subject to a terminal disclaimer.

(21) Appl. No.: 18/585,885

(22) Filed: Feb. 23, 2024

(65) Prior Publication Data

US 2024/0190696 A1    Jun. 13, 2024

Related U.S. Application Data

(62) Division of application No. 17/579,139, filed on Jan. 19, 2022, now Pat. No. 12,060,262.

(60) Provisional application No. 63/178,561, filed on Apr. 23, 2021.

(51) Int. Cl.
*B81B 3/00* (2006.01)
*H04R 13/00* (2006.01)

(52) U.S. Cl.
CPC ........... *B81B 3/0021* (2013.01); *H04R 13/00* (2013.01); *B81B 2201/0257* (2013.01); *B81B 2203/0127* (2013.01); *H04R 2201/003* (2013.01)

(58) Field of Classification Search
CPC .... H04R 13/00; H04R 2201/003; H04R 7/06; H04R 2307/023; H04R 2307/204; H04R 31/003; H04R 9/025; H04R 9/047; H04R 31/00; H04R 9/06; H04R 19/02; H04R 7/04; H04R 2307/025; B81B 3/0021; B81B 2201/0257; B81B 2203/0127
See application file for complete search history.

(56) References Cited

U.S. PATENT DOCUMENTS

| | | | | |
|---|---|---|---|---|
| 2009/0316937 A1* | 12/2009 | Zheng | ................... | H04R 19/00 381/396 |
| 2010/0104115 A1* | 4/2010 | Zheng | ..................... | H04R 1/00 381/412 |
| 2014/0035708 A1* | 2/2014 | Athanasiou | .......... | G09B 21/004 427/550 |

\* cited by examiner

*Primary Examiner* — Tuan D Nguyen
(74) *Attorney, Agent, or Firm* — BACON&THOMAS,PLLC

(57) ABSTRACT

Disclosed is a coil module, comprising: a vibrating membrane suspended on an air chamber defined and supported by a first substrate, at least one planar coil, embedded in the vibrating membrane, and at least a soft magnet, embedded in the vibrating membrane and disposed surrounding at least a portion of a contour of the planar coil; wherein a substantial portion of the planar coil locates at substantially the same plane where a portion of the soft magnet is arranged.

18 Claims, 8 Drawing Sheets

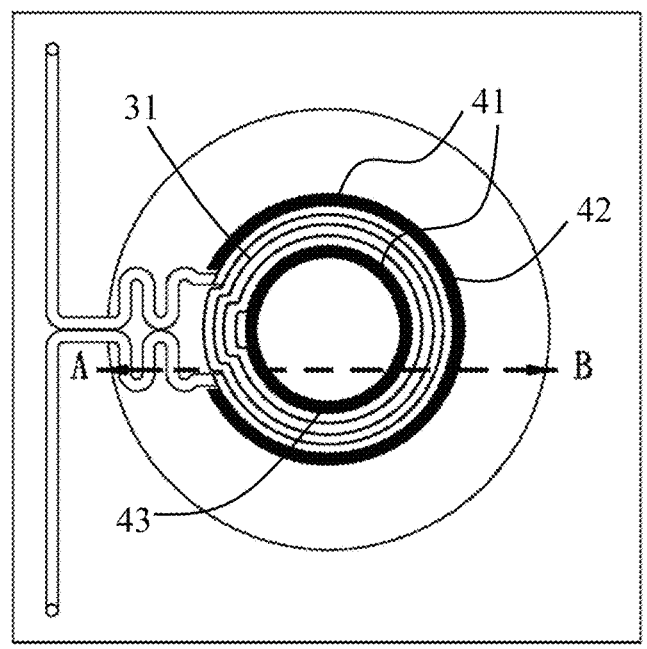
Fig. 3
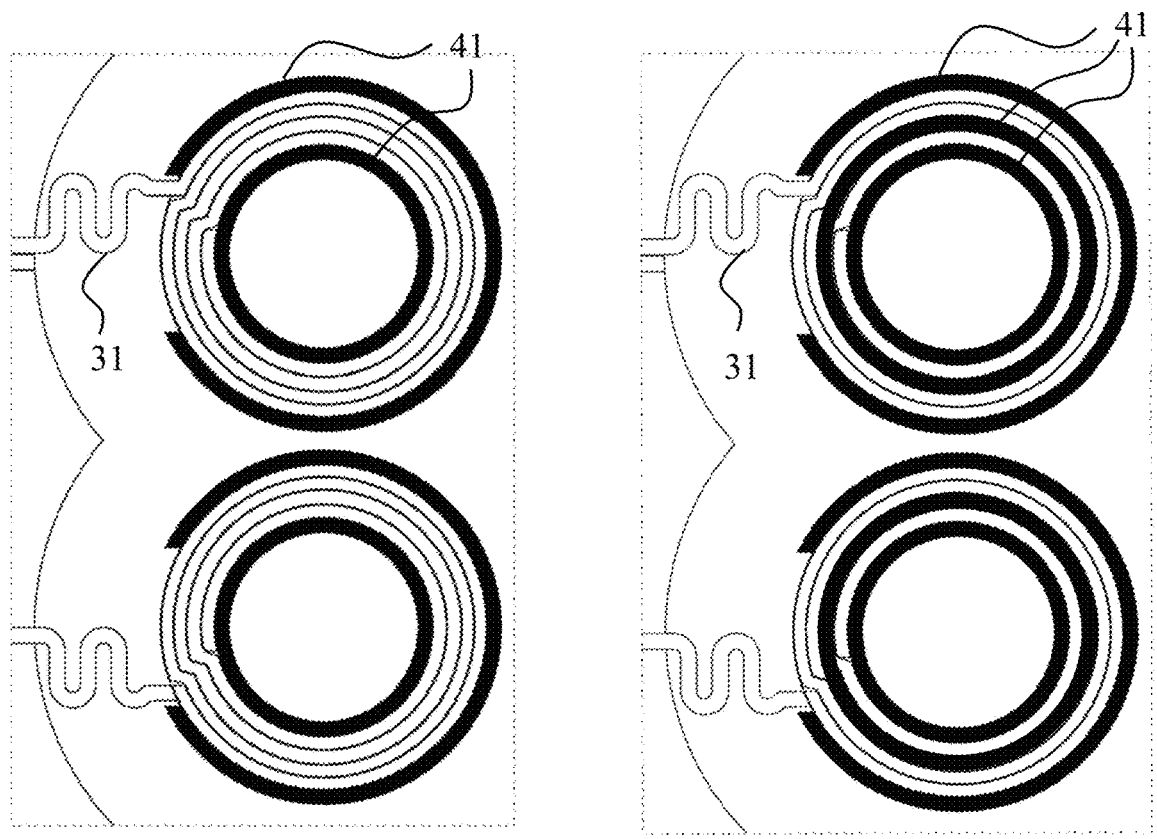
Fig. 3A
Fig. 3B

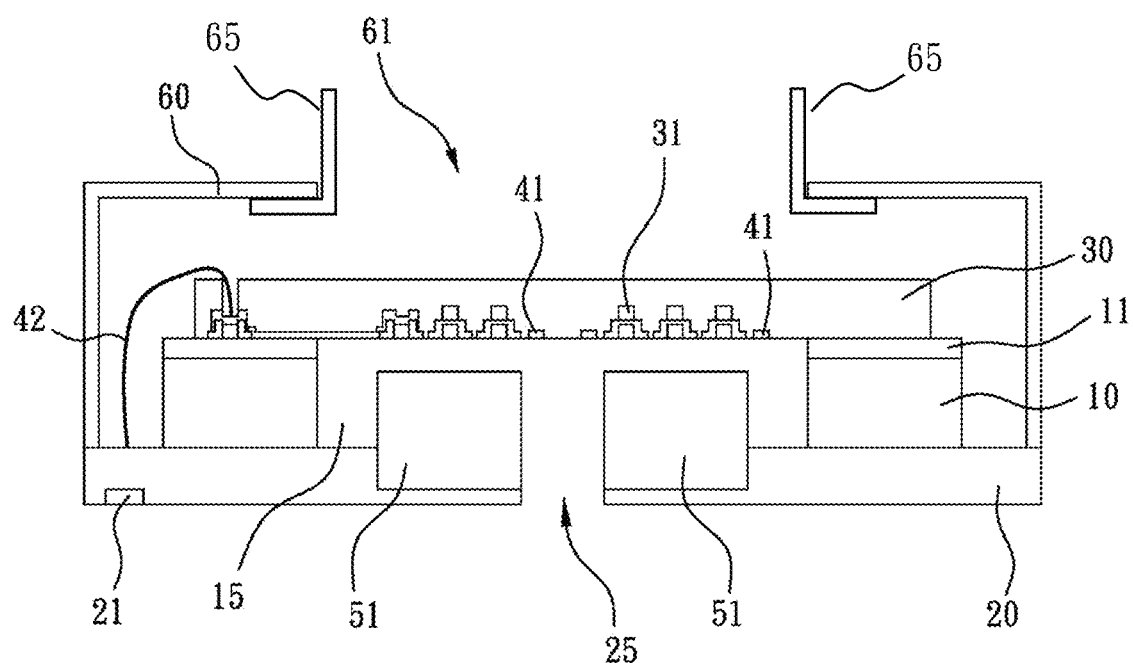
Fig. 6
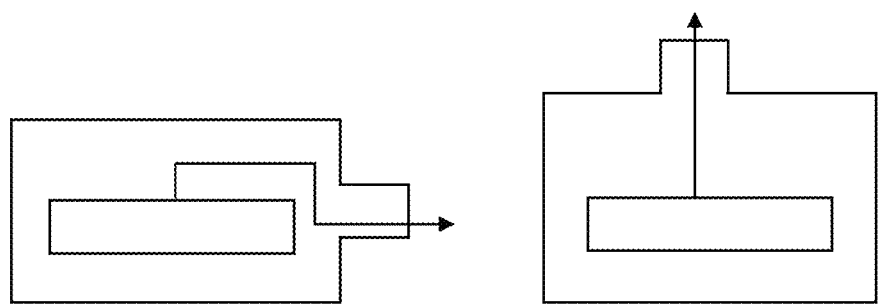
Fig. 7A                    Fig. 7B

Type 1
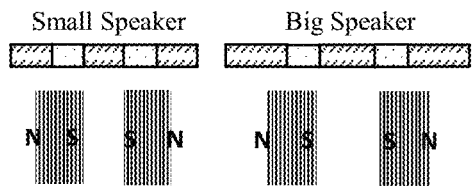
Fig. 10A
Type 2
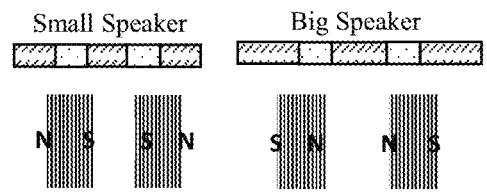
Fig. 10B
Type 3
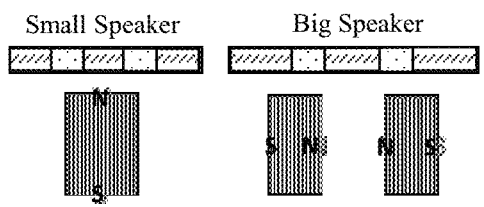
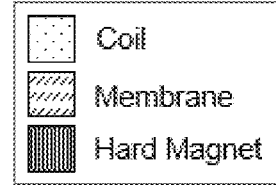
Fig. 10C
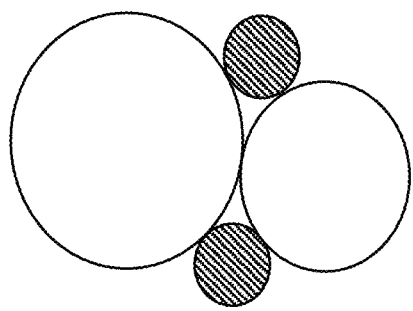
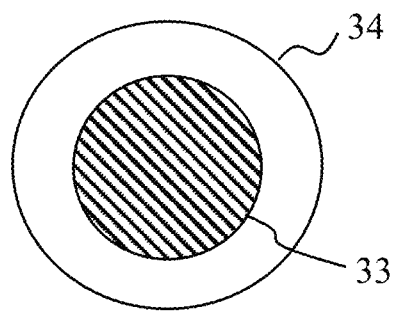
Fig. 11A
Fig. 11B

COIL MODULE FOR ELECTROMAGNETIC MICROSPEAKER, COIL MODULE ARRAY AND PREPARATION METHOD THEREOF

BACKGROUND OF THE INVENTION

Technical Field

The present invention relates to a coil module for MEMS (microelectromechanical system) electromagnetic microspeaker, especially to an actuator module suitable for the electromagnetic microspeaker and a method for preparation of the actuator and the microspeaker.

Prior Art

In a smart phone, when used in hands-free mode, nearly a third of battery power is consumed by the audio system in which a conventional speaker is used. Developing a microspeaker having high efficiency and high linearity has become an important task for engineers in this technical field. The microelectromechanical Systems (MEMS) technologies have offered the possibility of lower cost and high precision manufacturing for micro-scaled speakers.

The inventors have disclosed certain electromagnetic MEMS speakers in the following publications:
1. Chen, Y. C., Cheng, Y. T., A low-power milliwatt electromagnetic microspeaker using a PDMS membrane for hearing aids application, MEMS 2011, Cancun, MEXICO, Jan. 23-27, 2011, pages 1213-1216.
2. Jadhav, P. R., Cheng, Y. T., Fan, S. K., Liang, C. Y., A sub-MW electromagnetic microspeaker with bass enhancement using a parylene/graphene/parylene composite membrane, MEMS 2018, Belfast, Northern Ireland, UK., 21-25 Jan. 2018, pages 620-623.

In reference No. 1, disclosed is an electromagnetic MEMS speaker with a Polydimethylsiloxane (PDMS) membrane suspended on an air chamber supported by a silicon substrate. A planar Cu coil formed on the PDMS membrane is enclosed by a soft magnet layer, i.e., a NiFe soft magnet layer arranged surrounding the coil pattern. A coil module with the PDMS membrane, the air chamber, the coil and the soft magnet is coupled with an acrylic substrate provided with a hard magnet configured to locate right under the Cu coil, to form a microspeaker.

In reference No. 2, the PDMS membrane is replaced by a parylene/graphene/parylene composite membrane.

In addition, US20050275497A1 disclosed a "Microfabricated system for magnetic field generation and focusing" and disclosed a method of forming, on a Si substrate, planar micro-coils with coil windings of high aspect ratio and a wide variety of geometric shapes. The micro-coils have field enhancing ferromagnetic pillars rising above the micro-coil plane, formed at positions of maximum magnetic field strength. The micro-coils may also include magnetic layers formed beneath the substrate and contacting the pillars to form a substantially closed pathway for the magnetic flux. The substrate is thinned to membrane proportions.

US20140035708A1 discloses a "Magnetic actuators having a nanocomposite membrane." The magnetic actuator has a substrate, a membrane layer on the substrate. The membrane layer consists of a matrix of elastic polymer material and magnetic nanoparticles dispersed therein and a magnetic field generator. The magnetic nanoparticles are arranged in a pattern corresponding to the magnetic field generator and the magnetic field generator is disposed in a cavity, interposed between the substrate and the membrane layer.

WO2008106928A2 discloses a "Method for the production of membranes that can be electrically and/or magnetically activated, and magnetic actuator having such a membrane." In the method, magnetic microparticles or nanoparticles are mixed with a matrix material in a flowable state and are applied to a substrate as a layer. A distribution of the particles in the layer is modified by means of magnetic fields in order to achieve a pattern of magnetic substance. Solidate to form a membrane of magnetic actuator.

DE102014112531A1 discloses a "Method for producing a loudspeaker membrane," comprising the steps of: A) providing a film; B) providing a flowing powder mixture (2) of a plastic and a magnetic material; C) applying the powder mixture (2) as thick film (2) on the film (1); and E) aligning magnetic powder particles of the magnetic material with a magnetic field and bonding the powder mixture (2) to the film (1). A loudspeaker membrane formed by the product is also disclosed.

WO2017171757A1 discloses an "Electromagnetic haptic actuator integral with a multilayer substrate." A haptic actuator has an inductive coil formed in a package substrate material, an elastic membrane over the coil, a magnet on the membrane, and a power plane to supply a drive signal to move the magnet towards and away from the coil. Remove the package substrate material from within the coil to form a cavity surrounded by the coils. A cavity at the core of the coil is partially filled with a soft magnetic material.

Objectives of the Invention

One objective of the present invention is provide an electromagnetic microspeaker with a small size, while providing improved sound performances in both high and lower frequency regimes.

Another objective of this invention is to provide a new structure of an actuator module that is suitable for producing an electromagnetic microspeaker with a small size.

Another objective of this invention is to provide a new structure of a vibrating membrane that has a small thickness and provides improved sound performances in both high and lower frequency regimes.

SUMMARY OF THE INVENTION

In one aspect of this invention, a MEMS coil module is disclosed. The invented coil module comprises: a vibrating membrane suspended on an air chamber defined and supported by a first substrate, at least one planar coil, embedded in the vibrating membrane, and at least a soft magnet, embedded in the vibrating membrane and disposed surrounding at least a portion of a contour of the planar coil.

In some preferred embodiments of the present invention, the first substrate is made of a material selected from the group consisted of silicon, rubber, plastics, polymer, resin, wood, ceramics, glass, paper, and any combination thereof, and is preferably a silicon substrate. In the preferred embodiments, the planar coil is a metal coil or a metal alloy coil, such as a Cu coil, an Ag coil or an Al coil, and is preferably a Cu coil. Also in the preferred embodiments, the planar coil forms a planar pattern and the soft magnet comprises at least one strip disposed along a part of an outer contour or an inner contour of the planar pattern. The material of the soft magnet is not limited and is preferably selected from Fe, Co, Ni and their alloys, and is preferably a NiFe soft magnet.

In the preferred embodiments, the vibrating membrane is preferably one selected from a PDMS membrane and a parylene/graphene/parylene composite membrane. In the preferred embodiments, the outer contour of the vibrating membrane is a circle, an ellipse or a polygon selected from the group consisted of square, quadrilateral, pentagon and hexagon.

In such embodiments, as well as in other embodiments, the planar coil comprises at least one multi-layer structure and/or the soft magnet comprises at least one multi-layer structure. In some of these embodiments, a substantial portion of the planar coil locates at substantially the same plan where a portion of the soft magnet is arranged. In some embodiments, the planar coil comprises a spiral structure comprising at least one outer ring and an inner ring connecting in series. In some of such embodiments, the planar coil further comprises at least one ring arranged between and in connection with the outer ring and the inner ring. In such embodiments, the planar coil may further comprise soft magnet arranged between two coil rings, wherein a pattern formed by the soft magnet may have a shape corresponding to the adjacent outer and/or inner ring.

In a plurality of the preferred embodiments, the planar coil comprises one or more circular rings connected in series and arranged in layers. In such embodiments, the planar coil may further comprise soft magnet arranged between two coil layers, wherein a pattern formed by the soft magnet may have a shape corresponding to the upper and/or lower layer.

In the preferred embodiments of the invention, the planar coil forms a coil pattern, with an outer contour having the shape of a circle, an ellipse or a polygon, preferably a regular concentric polygon, such as a square, a pentagon, a hexagon etc. In some of these embodiments, the coil pattern has an inner contour having the shape corresponding to that of the outer contour.

In most embodiments, the soft magnet is arranged in a material layer other than a material layer of a coil ring. In some of these embodiments, a substantial portion of the planar coil locates at substantially the same plane where a portion of the soft magnet is arranged.

In some preferred embodiments, the coil module is provided in a MEMS structure, more preferably a CMOS structure.

In some embodiments, two or more planar coils are provided and embedded in the vibrating membrane. The plurality of planar coil is driven by one or more drivers and, when driven by two or more drivers, the drivers independently actuate a corresponding planar coil. In some preferred embodiments, one first planar coil is arranged within an area defined by a second planar coil, which in turn may be arranged within an area defined by a third planar coil. The first and second planar coils may be concentric.

The coil module may further comprise a lid encompassing the vibrating membrane. The lid provides a venting hole, to expose at least a portion of the planar coil. The venting hole may be open on top of the vibrating membrane, with a venting direction perpendicular or inclined to the membrane plane. The venting hole may be open on a side of the vibrating membrane, with a venting direction parallel or inclined to the membrane plane. In some embodiments, two or more venting holes are provided on the lid.

The coil module may further provide a second venting hole on the air chamber, to expose at least a portion of the air chamber. A venting direction of the venting hole may be perpendicular or inclined to the membrane plane.

According to another aspect, this invention provides a microspeaker comprising a coil module as described above and a second substrate coupling the substrate of the coil module at a side of the air chamber opposite to the vibrating membrane, to support the coil module and at least one hard magnet and to define the air chamber. The at least one hard magnet may be provided in the air chamber at a position corresponding to the at least one planar coil. In such embodiments, the air chamber forms a resonance chamber. The second substrate is preferably provided with at least one opening.

According to a third aspect, this invention provides a microspeaker comprising a coil module as described above and a second substrate coupling the substrate of the coil module at a side of the air chamber opposite to the vibrating membrane, to support the coil module and to define the air chamber. A lid encompassing the vibrating membrane is provided with at least one hard magnet extending into a space between the lid and the vibrating membrane from a position corresponding to the at least one planar coil. In such embodiments, the resonance chamber may be the chamber defined by the lid and the vibrating membrane. The second substrate is preferably provided with at least one opening. In such embodiments, the opening of the second substrate may be as wide as the air chamber. In such embodiments, the opening of the second substrate preferably forms a venting hole.

In these embodiments, the hard magnet may form a ring shape. The diameter/length/width of the hard magnet may be greater than that of the at least one planar coil.

According to a fourth aspect, the coil module with or without a lid further comprises a waveguide on the vibrating membrane. The waveguide preferably forms a cap and is coupled to the second substrate for configuring a pathway of output sounds of the microspeaker. The cap may be metal, silicon or glass, preferably a silicon cap holder. The waveguide may provide at least one through hole, for connecting an electrical contact to the planar coil. The through hole is preferably a through-silicon via (TSV), if the waveguide is a silicon cap holder.

BRIEF DESCRIPTION OF THE DRAWINGS

FIG. 3 shows an example of a geographic relation of a planar coil and a soft magnet that form a coil module in this invention. FIG. 3A and FIG. 3B respectively show an example of the coil pattern of two coil layers that form the planar coil of FIG. 3.

FIG. 6 is the cross-sectional view of a second embodiment of the microspeaker of this invention.

FIG. 7A and FIG. 7B respectively show two examples in the shape and structure of a waveguide suitable in the present invention.

FIG. 10A-10C are cross-sectional views of several possible combinations of a plurality of planar coils and a plurality of hard magnets, used in some embodiments of this invention.

FIG. 11A-11B are plan views showing two possible combinations of a plurality of microspeaker, used in some embodiments of this invention.

DETAILED DESCRIPTION OF THE INVENTION

In the followings, several embodiments of the microspeaker of the present invention will be described by reference to the drawings, so to demonstrate the design, features and effects of the present invention.

Figure 1:
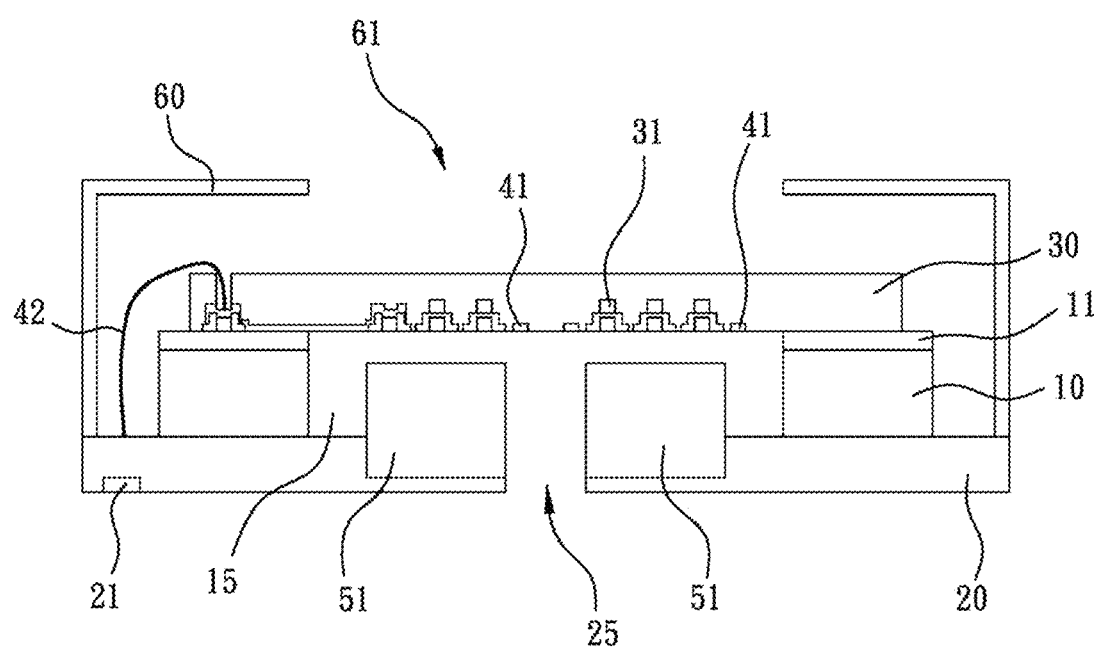
FIG. 1 is the cross-sectional view of a first embodiment of the microspeaker of this invention.

FIG. 1 shows the cross-sectional view of a first embodiment of the microspeaker of this invention. As shown in this figure, in the first embodiment the microspeaker has a vibrating membrane 30 with a planar coil 31 and soft magnets 41, 41 embedded in the vibrating membrane 30; first substrate 10 to support the vibrating membrane 30 and to define an air chamber 15, a second substrate 20 to cover a portion of the air chamber 15 and a hard magnet 51 supported by the second substrate 20. In addition, a lid 60 encompasses the assembly of the above, with a venting hole 61 to expose a portion of the assembly.

As shown in this figure, the coil 31 and the soft magnets 41, 41 are embedded in, and form a part of the vibrating membrane 30. The soft magnets 41, 41 are arranged adjacent to a contour of the planar coil 31, which details will be described hereinafter. The assembly of the vibrating membrane 30, the coil 31 and the soft magnets 41, 41 is supported by the first substrate 10, such that the walls of the first substrate 10 and the vibrating membrane 30 define an air chamber 15, which would function as a resonance chamber, when the vibrating membrane 30 vibrates. The assembly of the vibrating membrane 30, the coil 31 and the soft magnets 41, 41, along with the first substrate 10 forms a coil module.

The shape of the coil module is not limited. In the preferred embodiments, the outer contour of the vibrating membrane is a circle, an ellipse or a polygon selected from the group consisted of square, quadrilateral, pentagon and hexagon. Any other shape can be used, as long as it provides good vibrating effects.

FIG. 1 also shows a second substrate 20 being coupled with the first substrate 10, and supports the coil module. The second substrate 20 also supports a hard magnet 51 which is arranged in the air chamber 15 at a position corresponding to the coil 31. To be more specific, the hard magnet 51 is positioned right under the planar coil 31, with its planar shape corresponding to that of the coil. An opening 25 is formed in the second substrate 20. When the second substrate 20 is coupled with the first substrate 10, they and the vibrating membrane 30 jointly define the air chamber 15. The opening 25 in the second substrate 20 provides a venting hole for the air chamber 15. In the example of FIG. 1, the opening 25 is positioned under the core portion of the hard magnet 51, which means it locates at the center of the module. This, however, is not any technical limitation. The opening 25 can be formed at any position in the second substrate 20. In addition, the number of the opening is not limited to one.

In the example of FIG. 1, a lid 60 is provided to encompass the assembly of the coil module and the second substrate 20. The lid 60 has a venting hole 61, exposing a portion of the vibrating membrane 30. To be more specific, the venting hole 61 exposes a portion of the coil 31. However, the position, and the venting direction, of the venting hole 61 is not any technical limitation. In other embodiments, the venting hole 61 is provided on top of the vibrating membrane 30, with a venting direction perpendicular or inclined to the membrane plane 30. The venting hole 61 may be open on a side of the vibrating membrane 30, with a venting direction parallel or inclined to the membrane plane 30. In addition, the number of the venting hole 61 is not limited. Two or more venting holes may be provided on the lid 60. If more than one venting hole is provided, a group of two or more venting holes don't need to be separated; two or more holes may intersect to form one.

Material of the lid 60 is not limited. Any material that provides good resonance effects would be applicable. Preferable material for the lid 60 includes metal, plastic, ceramic, glass etc. and metal, especially steel is preferred.

The coil module may further provide a second venting hole 25 on the air chamber 15, to expose at least a portion of the air chamber 15. A venting direction of the venting hole 25 may be perpendicular or inclined to the membrane plane. In the preferred embodiments, the second venting hole 25 may be the opening 25 of the second substrate 20.

Figure 2:
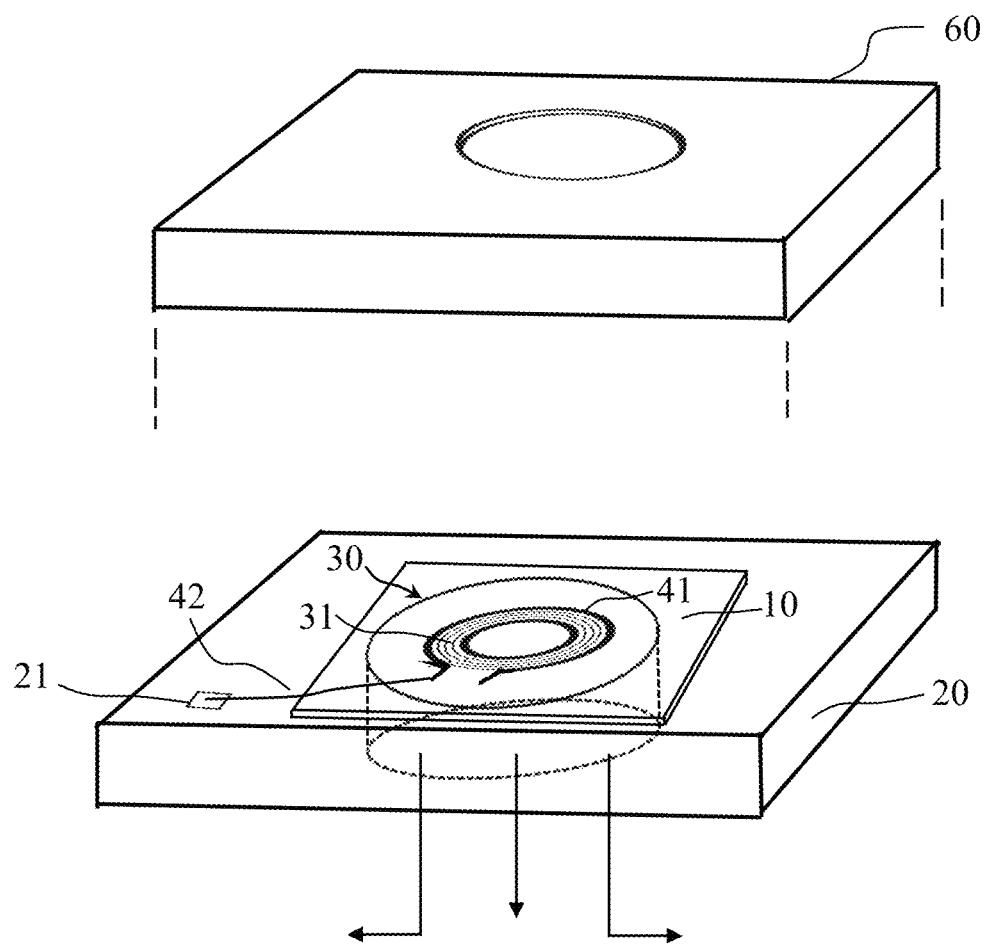
FIG. 2 shows the prospective view of an assembly including the embodiment of FIG. 1.

FIG. 2 shows the prospective view of a microspeaker including the embodiment of FIG. 1. FIG. 2 gives the reader a clearer view of the microspeaker of FIG. 1. As shown, the invented microspeaker has a coil module that comprises: a vibrating membrane 30 suspended on an air chamber 15 defined and supported by a first substrate 10, at least one planar coil 31 embedded in the vibrating membrane 30, and at least a soft magnet 41, 41 embedded in the vibrating membrane 30 and disposed surrounding at least a portion of a contour of the planar coil 31; a second substrate 20 coupling the first substrate 10 at a side of the air chamber 15 opposite to the vibrating membrane 30; the second substrate 20 supporting the coil module and at least one hard magnet 51 and to define the air chamber 15. In the example of FIG. 1, the at least one hard magnet 51 is provided in the air chamber 15, at a position corresponding to the at least one planar coil 31. In this embodiment, however, the hard magnet 51 is attached to the lower surface of the upper lid body of the lid 60 that has an upper lid body and two lower walls in connection with the upper lid body and is coupled with the second substrate, to encompass the vibrating membrane 30. A space defined by lid 60 and the vibrating membrane 30 forms a resonance chamber. The second substrate 20 is also provided with at least one opening 25, which diameter may be as large as the coil 31. An opening 61 is formed on the lid 60, to function as a venting hole. As described above, the number of the opening 61 is not limited to one.

In FIG. 2 it is shown that a pad 21 is prepared on the bottom of the second substrate 20, with wires 42 electrically connecting the pad 21 and the coil 31.

In the preferred embodiments of the present invention, the first substrate 10 may be made of a material selected from the group consisted of silicon, rubber, plastics, polymer, resin, wood, ceramics, glass, paper, and any combination thereof, and is preferably a silicon substrate. In the preferred embodiments, the planar coil 31 may be a metal coil or a metal alloy coil. Suitable material for the coil 31 includes Cu, Ag or Al. The coil 31 is preferably a Cu coil. The material of the soft magnet 41 is not limited and is preferably one selected from Fe, Co, Ni and their alloys, and is preferably a NiFe soft magnet. In addition, the vibrating membrane 30 is preferably one selected from a PDMS membrane and a parylene/graphene/parylene composite membrane. Preferably, the vibrating membrane 30 is a multi-layered membrane, so that it can be produced using the CMOS process. Suitable material for the second substrate 20 can be silicon, rubber, plastics, polymer, resin, wood, ceramics, glass, paper, and any combination thereof.

A preferred material for the second substrate 20 is acrylic. As for the hard magnet 51, it can be made of any known magnetic material, such as Fe and Fe alloys.

To produce a microspeaker, it is preferable to prepare the coil module in a MEMS (micro electromagnetic system) structure. A preferred process for a MEMS microspeaker is the CMOS process. Of course, this is not any technical limitation.

The coil 31 is preferably a planar coil, especially a MEMS planar coil and more preferably a MEMS planar coil in a CMOS structure. Although some material used in the production of a microspeaker is not a standard SMOS material, the CMOS process is useful in the preparation of the invented microspeaker, after necessarily minor changes.

In the preferred embodiments, the planar coil 30 forms a planar pattern. As in the conventional art, a planar coil may form a helical pattern or a circular pattern. In the present invention, the soft magnet comprises at least one strip disposed along a part of an outer contour or an inner contour of the planar pattern. The geographic relation of the planar coil 31 and the soft magnet 41 may be seen from FIG. 1 and FIG. 2. FIG. 3 shows an example, wherein the coil 31 forms a circular pattern and the soft magnet 41 includes two annular strips, with one wider annular strip 42 surrounding the outer contour of the planar coil pattern 31 and one narrower annular strip 43 lying along the inner contour of the planar coil pattern 31.

Figure 4:
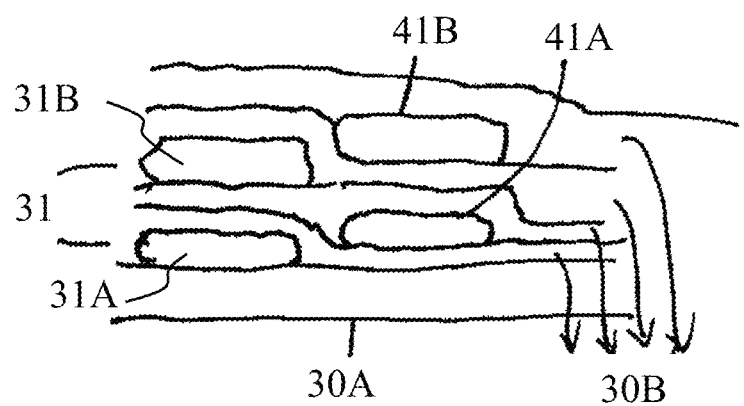
FIG. 4 is a cross-sectional view of a portion of the coil module of an embodiment of the microspeaker of this invention.

When the planar coil 31 has the CMOS structure, or a structure compatible to the CMOS structure, the planar coil 31 and/or the soft magnet 41 may form a multi-layer structure. In some of these embodiments, a substantial portion of the planar coil 31 may locate at substantially the same plane where a portion of the soft magnet 41 is arranged. An example of this feature is shown in FIG. 4, which is a cross-sectional view of a portion of the coil module of an embodiment of the microspeaker of this invention. As shown in FIG. 4, a planar coil 31 has two coil layers 31A and 31B. They are embedded in a multi-layered vibrating membrane 30. The multi-layered vibrating membrane 30 consisted of a bottom layer 30A, on which a coil layer 31A is formed. A first dielectric lawyer 30B is formed on the coil layer 31A and a first soft magnet layer 41A is formed on the first dielectric lawyer 30B. The first coil layer 31A and the first soft magnet layer 41A are separated and insulated by the first dielectric layer 30B, with a substantial portion of the planar coil 31 being at substantially the same plane of the soft magnet 41. This geographic relation applies to the second coil layer 31B and the second soft magnet layer 41B.

Although it is not intended to limit the scope of this invention, the structure described above is made possible mainly because of the etching process used in the preparation of the multilayered vibrating membrane. As can be seen from FIG. 4, the etching process produces an undulate topography for the dielectric layers, whereby a substantial portion of the planar coil 31 is arranged at substantially the same plane of the soft magnet 41. For example, when forming the first coil layer 31A, a metal layer is formed on the bottom layer 30, followed by etching to remove unneeded portions of the metal layer, to form the first coil layer 31A. The first dielectric layer 30B is formed on the first coil layer 31A and on the bottom lawyer portions where the metal layer is removed. The first dielectric layer 30B thus forms an undulate topography. The first soft magnet lawyer 41A is then formed on the first dielectric layer 30B, at an area where the first dielectric layer 30B is at a lower level. By doing so, a substantial portion of the planar coil 31 is arranged at substantially the same plane of the soft magnet 41.

As described above, the planar coil 31 may have a spiral structure, which comprises multiple layers. Preferably, it has at least one outer ring and an inner ring connecting in series. In addition, the spiral structure can further have at least one ring arranged between and in connection in series with the outer ring and the inner ring. In such embodiments, the planar coil 31 may further include soft magnet 41 arranged between two coil rings. The pattern formed by the soft magnet 41 is preferably a shape corresponding to the adjacent outer and/or inner ring.

Alternatively, the planar coil 31 may have one or more than one circular ring, connected in series and arranged in layers. In such embodiments, the planar coil 31 may further comprise soft magnet 41 arranged between two coil layers. Similar to the spiral structure, the pattern formed by the soft magnet may have a shape corresponding to the upper and/or lower layer. An example of this embodiment is shown in FIG. 3A that shows respectively the coil pattern of two coil layers that form one multi-layered planar coil. The two coil layers are connected in series and are surrounded by soft magnets 41 in their outer contour and inner contour.

Also as described above, the planar coil 31 forms a coil pattern. In some embodiments, the outer contour of the coil pattern may have the shape of a circle, an ellipse or a polygon. If it is a polygon, it is preferably a regular concentric polygon. Suitable shape of the polygon includes a square, a pentagon, a hexagon etc. In some of these embodiments, the coil pattern has an inner contour. The shape of the inner contour may correspond to the shape of the outer contour. They may also be different or irrelevant.

FIG. 3B shows an example wherein each coil layer is encompassed by multiple soft magnets 41.

Figure 5:
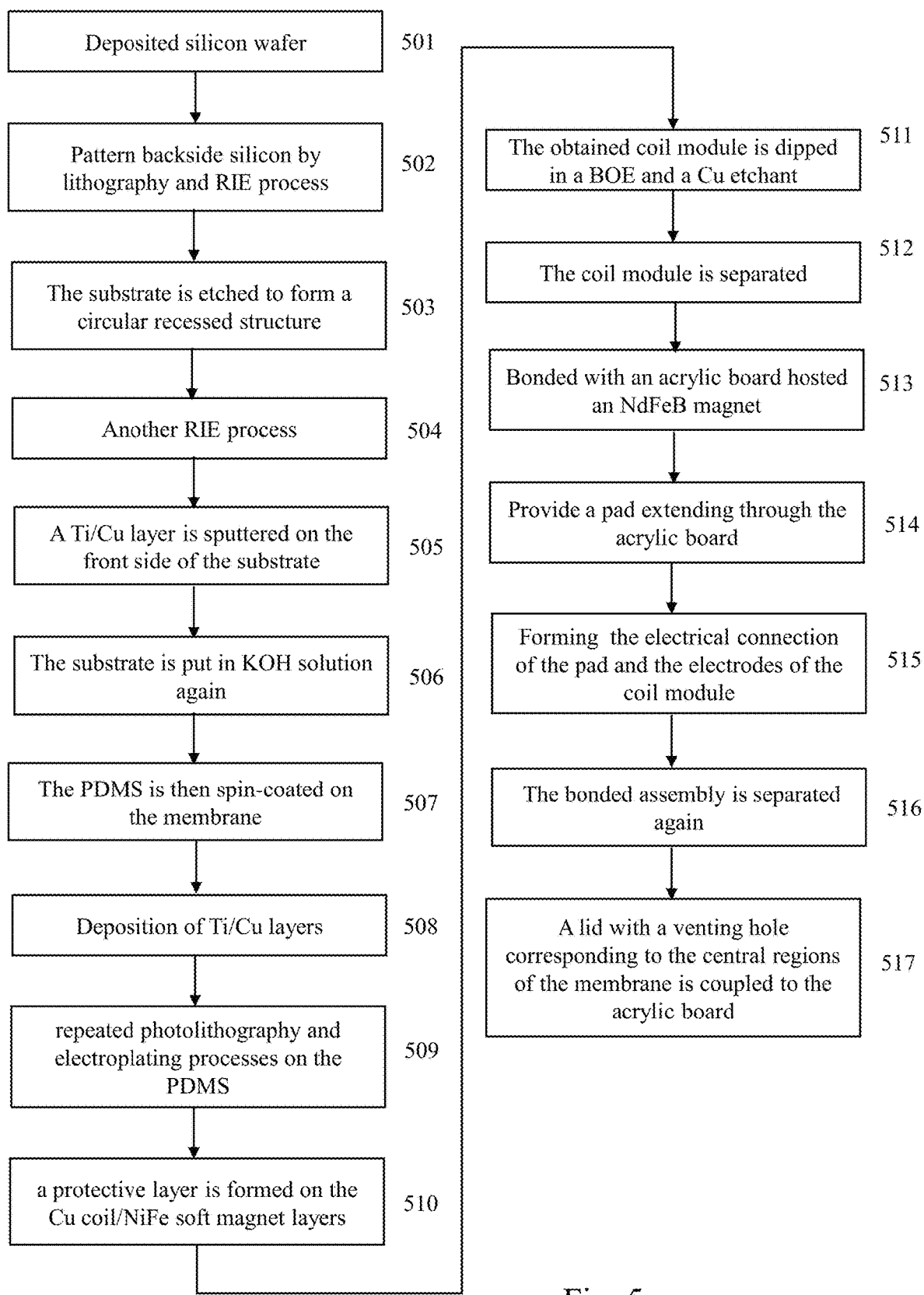
FIG. 5 shows the flowchart for one embodiment of the method for preparation of a microspeaker of this invention.

As described above, the microspeaker of the present invention may be prepared using the CMOS process. FIG. 5 shows the flowchart for one embodiment of the method for preparation of a microspeaker of this invention. The invented method will be described referring to FIG. 5.

As show in FIG. 5, the microspeaker may be prepared from the following steps: At 501 a silicon wafer is firstly deposited with an oxide layer as the mask layer for later silicon KOH etch. At 501, the backside silicon is then patterned by photolithography and RIE processes to form a circular area. At 503 the substrate is subsequently etched in a KOH solution with IPA for a predetermined period of time, to form a circular concave structure left with a thin silicon layer on the top. At 504 another RIE process is conducted to remove the nitride layer on the front-side and at 505, a Ti/Cu layer is sputtered on the front side of the substrate for a Cu plating as an etching-stop layer. The substrate is then put in the KOH solution again at step 506, to remove the residual Si layer and to form a circular oxide/Cu composite membrane. At 507 the PDMS is then spin-coated on the membrane and cured, followed by a Ti/Cu layer deposition for use as a seed/adhesion layer at step 508. At step 509, a Cu coil pattern and a NiFe soft magnet adjacent to a contour of the Cu coil pattern, preferably and a PDMS layer, are formed on the PDMS membrane after a series of alternative and repeated photolithography and electroplating processes on the PDMS. At 510, a protective layer is formed on the Cu coil/NiFe soft magnet layers. Thereafter, at 511 the obtained coil module is dipped in a BOE and a Cu etchant for removal of the seed layer in the structure and the oxide/Cu barrier layer underneath the PDMS membrane. The coil module is separated at step 512, then bonded with an acrylic board hosted an NdFeB magnet at 513. A pad extending through the acrylic board is provided at 514 and electrical connection of the pad and the electrodes of the coil module is formed at 515. At step 516 the bonded assembly is separated again. At step 517 a lid with a venting hole corresponding to the central regions of the membrane is coupled to the acrylic board. A coil module as shown in FIG. 1 is thus obtained.

In step 509 of the method described above, a Cu coil pattern and a NiFe soft magnet adjacent to a contour of the Cu coil pattern are formed on the PDMS membrane by an alternative and repeated photolithography and electroplating process on the PDMS. Due to the alternative and repeated photolithography and electroplating process, when, for example, a strip of soft magnet is formed after a layer of Cu coil and a PDMS layer covering the Cu Coil layer are formed, a substantial portion of the soft magnet layer would position at substantial the same plane/level of the coil layer, because a coil material that might have existed right outside the outer contour of the coil pattern has been removed in the etching step. FIG. 4 shows one example of the obtained coil module. In the example of FIG. 4, both the planar coil 31 and the soft magnet 41 are embedded in the vibrating membrane 30.

FIG. 6 shows another embodiment, wherein the MEMS microspeaker further comprises a waveguide 65. The waveguide confines the pathway of the output sound of the microspeaker. In the example shown in FIG. 6, the waveguide is a cap holder, preferably a silicon cap holder, coupled to the lid 60. The waveguide 65 useful in this invention includes any material, shape and form, as long as the waveguide 65 can guide the sound produced by the microspeaker to a predetermined direction or predetermined directions. FIG. 7A and FIG. 7B respectively show two examples in the shape and structure of the waveguide. The respective examples are characterized by the direction of the output sound, shown in dashed arrow in the drawings. Other material than silicon, such as metal, ceramic, glass etc., can also be used to produce the waveguide.

Figure 8:
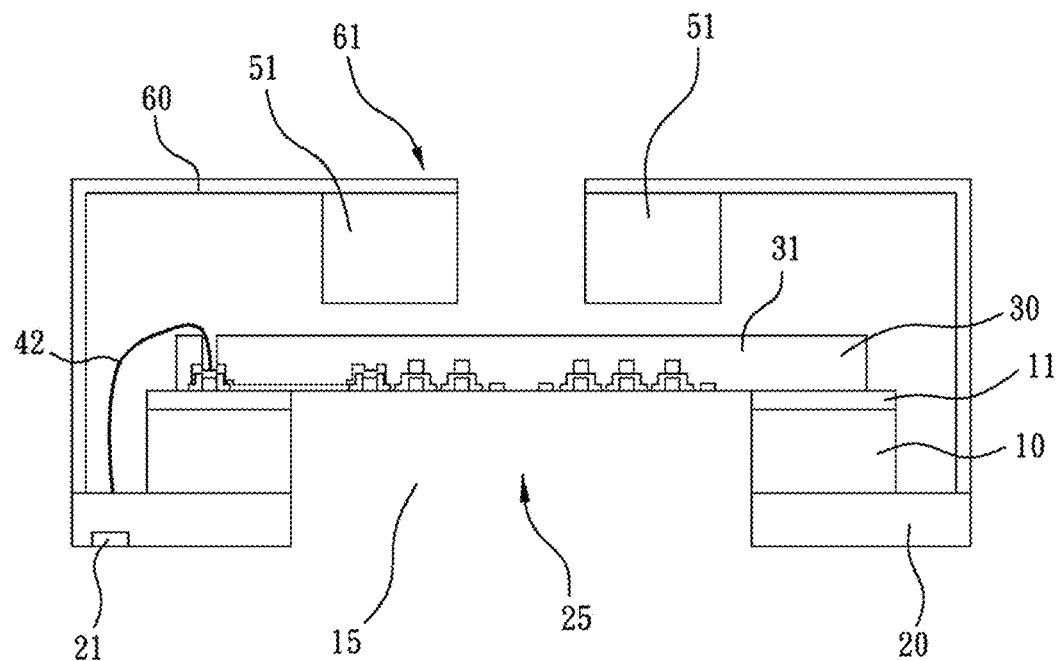
FIG. 8 is the cross-sectional view of a third embodiment of the microspeaker of this invention.
Figure 9:
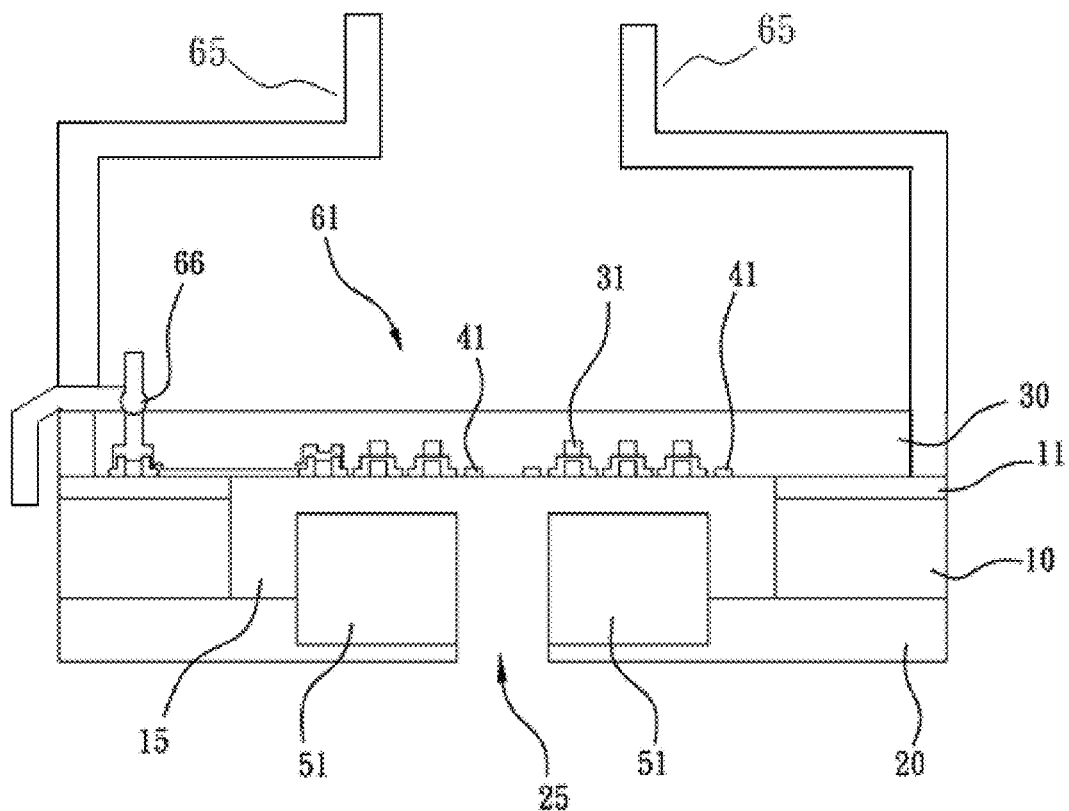
FIG. 9 is the cross-sectional view of a fourth embodiment of the microspeaker of this invention.

FIG. 8 shows a third embodiment, wherein the magnetic ring of the hard magnet 51 is attached to the package lid 60 and located exactly right on the top of the planar coil 31, whereby the speaker sound goes out from the second substrate 20 side. In the preferred embodiments, the width (diameter) of the opening 25 of the second substrate 20 may be as large as that of the air chamber 15. In the fourth embodiment shown in FIG. 9, there is no lid covering the package. The waveguide 65, preferably a cap holder, is provided with vias 66, preferably a through silicon vias (TSVs), for the provision of electrical connects to the top side of the speaker.

In some embodiments, two or more planar coils are provided and embedded in the vibrating membrane.

FIG. 10A-10C are cross-sectional views and show several possible combinations of a plurality of planar coils and a plurality of hard magnets, used in some embodiments of this invention. As shown in these figures, the coil module comprises a membrane of a small size and a membrane of a large size. FIG. 10A shows an embodiment in which the microspeaker comprises two permanent magnet rings aligned with the same polarity order, FIG. 10B shows an embodiment of similar structure but the two permanent magnet rings are aligned with opposite polarity orders, while FIG. 10C shows an embodiment in which the microspeaker comprises one permanent magnet ring 51 and one solid cylinder magnet 52, aligned with orthodontic polarity directions.

In some embodiments, two or more microspeaker, or coil modules, can be provided and prepared as one module in one process.

FIG. 11A-11B are plan views and show two possible combinations of a plurality of microspeaker, used in some embodiments of this invention. As shown in these figures, the plurality of microspeaker includes at least one microspeaker with a bandwidth of lower frequencies and one microspeaker with a bandwidth of higher frequencies. In FIG. 11A, 1 bass, 1 mid-range and 2 twitter speakers are formed in one coil module. In FIG. 11B, two speakers are formed in the same membrane and respectively include a first coil 33 with a small size/diameter and a second coil 34 with a larger size/diameter arranged at a peripheral of the first coil 33. In the preparation of a coil module with a plurality of coils, material for the plurality of coil and/or the plurality of soft magnet may be applied to the substrate or the membrane layer in one process step or in different process steps. A plurality of coil may be formed in separated membranes, while they can also share one vibrating membrane. The material of the plurality of coils and/or the plurality of soft magnet can be the same or different. In the example of FIG. 7B, the first coil 33 may provide a pad (not shown), to be connected by a lead or a wire leading to a direction perpendicular to the coil plane. Alternatively, the pad may extend to form a lead that trespasses over or beneath the second coil 34 and ends at the external of the second coil 34, where a lead or a wire can be connected.

What is claimed is:

1. A coil module, comprising:
   a vibrating membrane,
   at least one planar coil, embedded in the vibrating membrane, and
   at least a soft magnet, embedded in the vibrating membrane and disposed surrounding at least a portion of a contour of the planar coil;
   wherein a substantial portion of the planar coil locates at substantially the same plane where a portion of the soft magnet is arranged.

2. The coil module according to claim 1, wherein the planar coil forms a planar pattern and the soft magnet comprises at least one strip disposed along a part of an outer contour or an inner contour of the planar pattern.

3. The coil module according to claim 1, wherein the planar coil comprises at least one multi-layer structure and/or the soft magnet comprises at least one multi-layer structure.

4. The coil module according to claim 1, wherein an outer contour of the vibrating membrane is a circle, an ellipse or a polygon selected from the group consisted of square, quadrilateral, pentagon and hexagon.

5. The coil module according to claim 1, wherein the planar coil is a metal coil or a metal alloy coil, selected from the group consisted of a Cu coil, an Ag coil or an Al coil, and is preferably a Cu coil.

6. The coil module according to claim 1, wherein the material of the soft magnet is not limited and is preferably selected from Fe, Co, Ni and their alloys, and is preferably a NiFe soft magnet.

7. The coil module according to claim 1, wherein the vibrating membrane is one selected from a Polydimethylsiloxane (PDMS) membrane and a parylene/graphene/parylene composite membrane.

8. The coil module according to claim 1, wherein the planar coil comprises a spiral structure comprising at least one outer ring and an inner ring connecting in series.

9. The coil module according to claim 8, wherein the planar coil further comprises at least one ring arranged between and in connection with the outer ring and the inner ring.

10. The coil module according to claim 9, further comprising soft magnet arranged between two coil rings, wherein a pattern formed by the soft magnet has a shape corresponding to the adjacent outer and/or inner ring.

11. The coil module according to claim 1, wherein the planar coil comprises a plurality of circular rings connected in series and arranged in layers.

12. The coil module according to claim 11, further comprising soft magnet arranged between two coil layers, wherein a pattern formed by the soft magnet has a shape corresponding to the upper and/or lower layer.

13. The coil module according to claim 1, wherein the planar coil forms a coil pattern, with an outer contour having the shape of a circle, an ellipse or a polygon, selected from the group consisted of a square, a pentagon, a hexagon etc.

14. The coil module according to claim 1, wherein the soft magnet is arranged in a material layer other than a material layer of a coil ring and a substantial portion of the planar coil locates at substantially the same plane where a portion of the soft magnet is arranged.

15. The coil module according to claim 1, further comprising at least one additional planar coil embedded in the vibrating membrane.

16. The coil module according to claim 15, wherein the one planar coil and the at least one planar coil are configured to be driven by at least two separate drivers.

17. The coil module according to claim 15, wherein one first planar coil is arranged within an area defined by a second planar coil.

18. The coil module according to claim 17, wherein the first and second planar coils are concentric.

* * * * *